United States Patent [19]

Osawa

[11] Patent Number: 5,160,990
[45] Date of Patent: Nov. 3, 1992

[54] MIS-FET WITH SMALL CHIP AREA AND HIGH STRENGTH AGAINST STATIC ELECTRICITY

[75] Inventor: Nobuhiko Osawa, Yamanashi, Japan

[73] Assignees: Pioneer Electronic Corporation, Tokyo; Pioneer Video Corporation, Yamanashi, both of Japan

[21] Appl. No.: 286,817

[22] Filed: Dec. 20, 1988

[30] Foreign Application Priority Data

Jan. 21, 1988 [JP] Japan .................. 63-11512

[51] Int. Cl.$^5$ ............................. H01L 29/06
[52] U.S. Cl. ............................. 257/355; 257/367
[58] Field of Search .................. 357/53, 23.13, 23.8, 357/23.1

[56] References Cited

U.S. PATENT DOCUMENTS 3,405,329 10/1968 Loro et al. .................. 357/53
3,463,977 8/1969 Grove et al. ................ 357/53
4,567,502 1/1986 Nakagawa et al. ........... 357/53
4,713,681 12/1987 Beasom .................. 357/53

FOREIGN PATENT DOCUMENTS 2823629 12/1978 Fed. Rep. of Germany ........ 357/53

Primary Examiner—Andrew J. James
Assistant Examiner—Courtney A. Bowers
Attorney, Agent, or Firm—Sughrue, Mion, Zinn, Macpeak & Seas

[57] ABSTRACT

A metal insulated semiconductor field effect transistor (MIS-FET) includes a substrate, a semiconductor layer, and an oxide film on the semiconductor layer. Source and drain regions are formed by doping the semiconductor layer with impurities. A gate electrode is formed on the oxide film between the source and drain regions. An electrode is provided on the opposite side of the drain region from the gate electrode without contacting the gate electrode. The electrode is connected to either the source region or the substrate. Thus, a high strength against static electricity is performed without using a large area on the chip.

34 Claims, 3 Drawing Sheets

MIS-FET WITH SMALL CHIP AREA AND HIGH STRENGTH AGAINST STATIC ELECTRICITY

TECHNICAL FIELD OF THE INVENTION

The present invention relates to field effect transistors (hereinafter referred to as FETs) and particularly to FETs of a MIS (metal insulated semiconductor) structure.

BACKGROUND OF THE INVENTION

The output stage of a conventional integrated circuit constituted by MIS-FETs has the structure shown in FIGS. 4 and 5 when it is formed of a silicon gate complementary MOS (hereinafter referred to as silicon gate C-MOS) inverter. Equivalent elements in FIGS. 4 and 5 are designated by the same reference numerals, and the structure illustrated in those drawings is obtained in a manner as follows. That is, boron ions or the like are doped into one of the main surfaces of an N-type semiconductor or substrate 1 at a region thereof in which an N-channel FET is to be formed. Then the substrate is subjected to heat treatment so that a P-well region 3 is formed. Thereafter, an LOCOS (Local Oxidation of Silicon) oxide film 2 is formed through selective oxidization of a region of the substrate other than the region where N-channel and p-channel FETs are to be formed. Then, a gate oxide film 4 is formed on the main surface of the N-type semiconductor substrate 1 in the region where FETs and a polysilicon gate electrode 5 are formed. Using the polysilicon gate electrode 5 and the LOCOS oxide film 2 as a mask, an impurity is doped to form drain and source regions 6a and 7a of the N-channel FET and drain and source regions 6b and 7b of the P-channel FET. Thereafter, a chemical vapor deposition (CVD) oxide film 8 is deposited, the oxide film is removed through photo-etching at portions where contact holes are to be formed, an electrically conductive layer of aluminum or the like is deposited through evaporation over the whole surface, and a wiring pattern is formed through photo-etching to thereby form source electrodes 9a and 9b and a drain electrode 10. Thus, a silicon gate C-MOS inverter as shown in FIGS. 4 and 5 is completed.

In a structure such as the one described above, there are some problems. If the drain electrode 10 is directly connected to a pad electrode in view of the switching speed and the current characteristic, breakdown is apt to occur in the insulator film between the drain regions 6a and 6b and the gate electrode 5. Electric lines of force indicating the electric field concentrate most in junctions between the drain regions 6a and 6b and the P-well region 3 and the substrate 1, respectively, upon external application of a high voltage to the pad electrode due to static electricity.

Accordingly, a device as shown in FIG. 6 has been proposed in which a resistor 14 formed by diffusion or polysilicon is connected between a pad electrode 13 and each of the drain electrodes of P-channel and N-channel FETs 11 and 12 forming a silicon gate C-MOS inverter. A device as shown in FIG. 7 has also been proposed in which a dummy FET circuit 19 constructed by FETs 15 and 16 and resistors 17 and 18 is connected in parallel to the drain electrodes of P-channel and N-channel FETs 11 and 12 forming a silicon gate C-MOS inverter.

In a device having the resistor 14 connected as shown in FIG. 6 there have been problems in reduction of the rising and falling rates of an output signal, generation of oscillation, etc., due to the integration action of the resistor 14 and the output load capacitance. In such a device provided with the dummy FET circuit 19 as shown in FIG. 7, an advantage has been that, since the junction face portion between the substrate and the drain region at the gate side where breakdown may occur is elongated, the breakdown current density at this place can be lowered so that the strength against static electricity can be improved while maintaining predetermined driving capability, but a defect is that the area of the output stage inevitably becomes large.

SUMMARY OF THE INVENTION

The present invention has been attained in view of the above disadvantages in conventional MIS-FETs and an object thereof is to provide MIS-FETs in which the strength against static electricity can be improved without making the output electrical characteristic deteriorate and without increasing the area occupied on the chip.

The MIS-FET is provided with an electrode in the vicinity of a drain region on an insulator film. The electrode does not contact a gate electrode and is connected to a source region or a substrate region.

DETAILED DESCRIPTION OF THE PREFERRED EMBODIMENT

Figure 1:
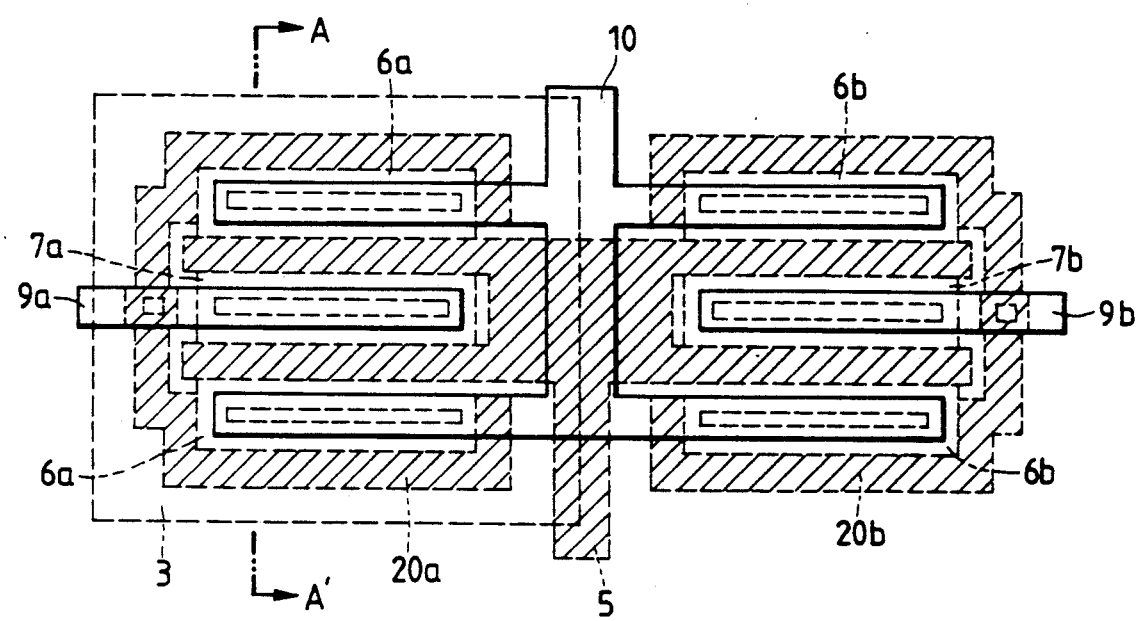
FIG. 1 is a view showing an embodiment of the present invention.
Figure 2:
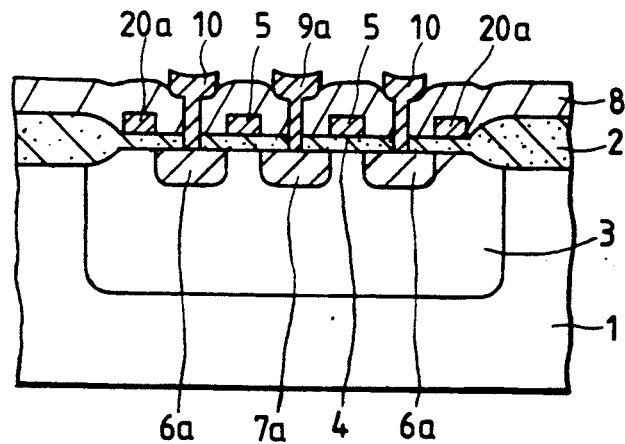
FIG. 2 is a section along the line A—A' in FIG. 1.
Figure 3:
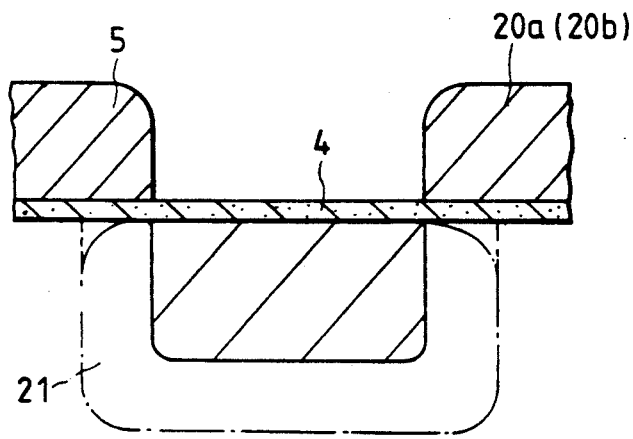
FIG. 3 is a view showing a depletion layer.

Referring to FIGS. 1-3, an embodiment of the present invention will be described in detail hereunder.

Figure 4:
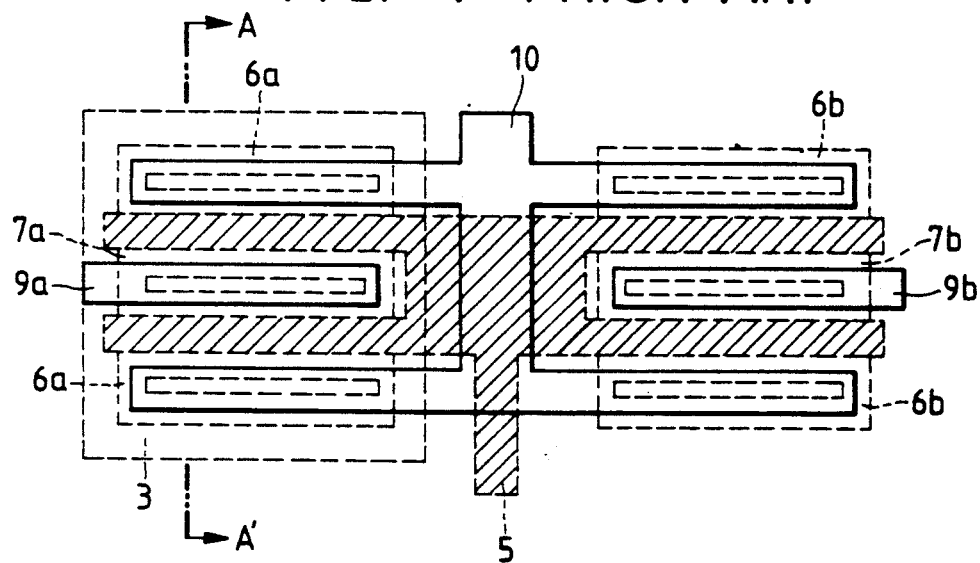
FIG. 4 is a view showing a conventional MIS-FET.
Figure 5:
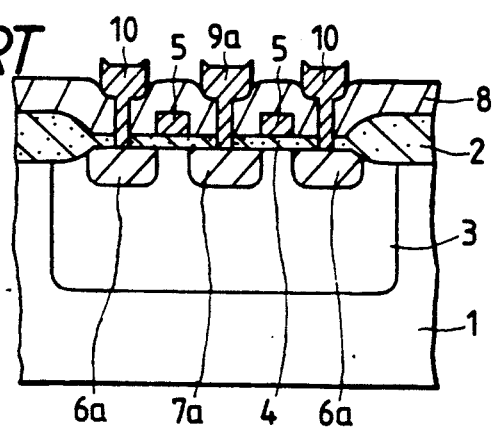
FIG. 5 is a section along the line A—A' in FIG. 4.
Figure 6:
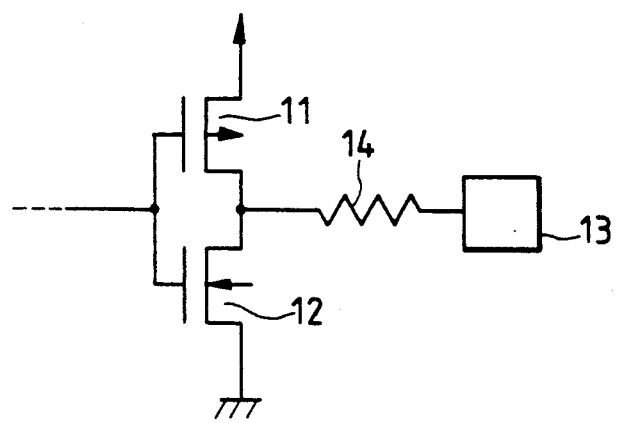
FIGS. 6 and 7 are circuit diagrams showing the output stages constituted by C-MOS inverters formed of the conventional MIS-FETs.
Figure 7:
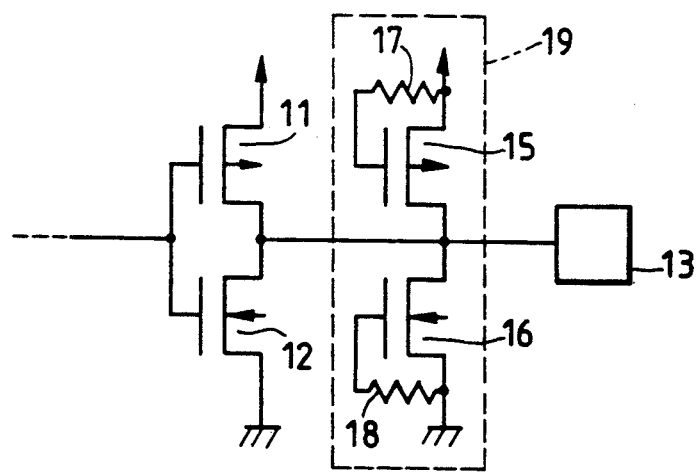

Corresponding to FIGS. 4 and 5. FIGS. 1 and 2 illustrate the arrangement of a silicon gate C-MOS inverter constituted by MIS-FETs according to the present invention. Equivalent elements in FIGS. 1 and 2 are designated by the same reference numerals. In FIGS. 1 and 2, an LOCOS oxide film 2 due to selective oxidization on one main surface of an N-type semiconductor 1, a P-well region 3, and a gate oxide film 4 are formed in the same manner as in the device of FIGS. 4 and 5. In this embodiment, however, electrodes 20a and 20b are then formed simultaneously with formation of a polysilicon gate electrode 5 so that a portion of the P-well region 3 which will be a drain region is surrounded. Impurity doping is performed by the use of the polysilicon gate electrode 5, the electrodes 20a and 20b, and the LOCOS oxide film 2 as a mask to form drain and source regions 6a and 7a of the N-channel FET and drain and source regions 6b and 7b of the P-channel FET. Thereafter, a CVD oxide film 8 is deposited, the oxide film is removed through photo-etching at portions which will be contact holes, an electrically conductive layer of aluminum or the like is deposited through evaporation over the whole surface, and a wiring pattern is formed through photo-etching to thereby form source electrodes 9a and 9b and a drain electrode 10. In the step of removing the oxide film 8 immediately before aluminum evaporation for the formation of the wiring pattern, the oxide 8 is removed in such a manner that the electrodes 20a and 20b are connected to the source electrodes 9a and 9b, respectively. Thus, a silicon gate C-MOS inverter as shown in FIGS. 1 and 2 is completed.

In the above arrangement, the electrodes 20a and 20b are formed so that the electrodes 20a and 20b contact at their peripheries with sides of a rectangle formed by lines of intersection between the surface of the gate oxide film 4 and the junction faces between the drain regions 6a or 6b and the P-well region 3 or the substrate 1, except in the vicinity of the gate electrode 5. Further, since the electrodes 20a and 20b are connected to the source electrodes 9a and 9b, respectively, a depletion layer 21 is widened as shown in FIG. 3. The width of the depletion layer 21 near the junction surface becomes narrow in the vicinity of the gate electrode 5 because of the influence of the gate electrode 5, so that breakdown occurs in this portion. Because of the existence of the electrodes 20a and 20b, the width of the depletion layer also becomes narrow in the vicinity of the electrodes 20a and 20b so that breakdown also occurs in this portion to thereby lower the current density at the time of breakdown. The broken line shows the state where the electrodes 20a and 20b are not provided.

Thus, since the gate region side surface portion of the drain-substrate junction where lines of force concentrate most is extended to be substantially equal to the length of the drain circumference to lower the current density at breakdown, it is possible to prevent breakdown in the gate insulator film and in the drain-substrate junction from occurring due to static electricity applied to the drain region from the pad electrode. Thus, a device is formed which has a high resistance to static electricity without providing a dummy FET which includes a protecting resistor and which causes the output characteristic to deteriorate while also requiring a large area on the chip.

In the above embodiment, the electrodes 20a and 20b are formed so that the electrodes 20a and 20b contact at their peripheries with sides of a rectangle formed by lines of intersection between the surface of the gate oxide film 4 and the junction between the drain regions 6a or 6b and the p-Well region 3 or the substrate 1, except in the vicinity of the gate electrode 5. However, the electrodes 20a and 20b may be formed so that the electrodes 20a and 20b cover the sides of the rectangle. Alternatively, the electrodes 20a and 20b may be formed at portions somewhat separated from those sides of the rectangle.

Further, although the electrodes 20a and 20b are connected to the source electrodes 9a and 9b, respectively, in the above embodiment, the electrodes 20a and 20b may be connected to a substrate region.

Although the above description has been made as to the case of a silicon gate C-MOS structure, the present invention may be applied to a device constituted by either one of a P-channel FET or an N-type FET or a device in which a gate electrode is formed of aluminum.

As described above in detail, the MIS-FET according to the present invention includes an electrode distributed in the vicinity of a drain region on an insulator film without contacting a gate electrode and connected to a source region or a substrate region. Thus, the current density at breakdown is lowered, so that it is possible to prevent breakdown in the gate insulator film as well as in the drain-substrate junction from occurring due to static electricity applied to the drain region from the pad electrode. Using the MIS-FET of the present invention, it is possible to form a device having high strength against static electricity without providing a dummy FET which requires a protecting resistor causing the output characteristic to deteriorate and which requires a large area on the chip.

What is claimed is:

1. A metal insulated semiconductor field effect transistor (MIS-FET), comprising:
    a substrate region;
    a semiconductor layer of a predetermined conductivity type formed in a portion of said substrate region;
    a source region and a drain region formed separately from each other within said semiconductor layer;
    an insulator film formed on a surface of said semiconductor layer;
    a source electrode in contact with said source region;
    a gate electrode formed on said film between said source region and said drain region; and
    a further electrode on said film near said drain region, not in contact with said gate electrode and connected to one of said source electrode and said substrate region.

2. A MIS-FET as claimed in claim 1, wherein said gate electrode is aluminum.

3. A MIS-FET as claimed in claim 1, wherein said MIS-FET is included in a silicon gate C-MOS structure.

4. A MIS-FET as claimed in claim 1, wherein said MIS-FET is a P-channel FET.

5. A MIS-FET as claimed in claim 1, wherein said MIS-FET is an N-channel FET.

6. A MIS-FET as claimed in claim 1, wherein said further electrode contacts at its periphery with the sides of a rectangle formed by lines of intersection between a surface of said insulator film and junction faces between said drain region and said semiconductor layer except in the vicinity of said gate electrode.

7. A MIS-FET as claimed in claim 1, wherein said further electrode covers the sides of a rectangle formed by lines of intersection between a surface of said insulator film and junction faces between said drain region and said semiconductor layer except in the vicinity of said gate electrode.

8. A MIS-FET as claimed in claim 1, wherein said further electrode is formed at portions a predetermined distance from the sides of a rectangle formed by lines of intersection between a surface of said insulator film and junction faces between said drain region and said semiconductor layer except in the vicinity of said gate electrode.

9. A MIS-FET as claimed in claim 1, wherein said drain region includes first and second drain subregions with said source region therebetween, and with said gate electrode including portions disposed on said insulator film between said source region and each of said drain subregions, said further electrode being disposed on said insulator film on a side of each of said drain subregions opposite said source region.

10. A MIS-FET as claimed in claim 9, wherein said further electrode has edges vertically aligned with edges of said drain subregions on a side away from said source region.

11. A MIS-FET as claimed in claim g, wherein said further electrode is disposed above junction faces between said drain subregions and said semiconductor layer.

12. A MIS-FET as claimed in claim 9, wherein said further electrode has an edge at a predetermined distance from junction faces between said drain subregions and said semiconductor layer so that said further electrode is not disposed above said junction faces.

13. A MIS-FET as claimed in claim 1, wherein said drain region includes an edge on a side away from said source region.

14. A MIS-FET as claimed in claim 13, wherein said further electrode has an edge vertically aligned with said drain region edge.

15. A MIS-FET as claimed in claim 13, wherein said further electrode is disposed above a junction face between said drain region and said semiconductor layer.

16. A MIS-FET as claimed in claim 13, wherein said further electrode has an edge at a predetermined distance from a junction face between said drain region and said semiconductor layer so that said further electrode is not disposed above said junction face.

17. A metal insulated semiconductor field effect transistor (MIS-FET), comprising:
a substrate region;
a source region and a drain region formed separately from each other within said substrate region;
an insulator film formed on a surface of said substrate region;
a source electrode in contact with said source region;
a gate electrode formed on said film between said source region and said drain region; and
a further electrode on said film near said drain region, connected to said substrate region and not in contact with said gate electrode.

18. A MIS-FET as claimed in claim 17, wherein said gate electrode is aluminum.

19. A MIS-FET as claimed in claim 17, wherein said MIS-FET is included in a silicon gate C-MOS structure.

20. A MIS-FET as claimed in claim 17, wherein said MIS-FET is a P-channel MIS-FET.

21. A MIS-FET as claimed in claim 17, wherein said MIS-FET is an N-channel MIS-FET.

22. A MIS-FET as claimed in claim 17, wherein said further electrode contacts at its periphery with the sides of a rectangle formed by lines of intersection between a surface of said insulator film and junction faces between said drain region and said substrate region except in the vicinity of said gate electrode.

23. A MIS-FET as claimed in claim 17, wherein said further electrode covers the sides of a rectangle formed by lines of intersection between a surface of said insulator film and junction faces between said drain region and said substrate region except in the vicinity of said gate electrode.

24. A MIS-FET as claimed in claim 17, wherein said further electrode is formed at portions at a predetermined distance from the sides of a rectangle formed by lines of intersection between a surface of said insulator film and junction faces between said drain region and said substrate region except in the vicinity of said gate electrode.

25. A MIS-FET as claimed in claim 17, wherein said drain region includes first and second drain subregions with said source region therebetween, and with said gate electrode including portions disposed on said insulator film between said source region and each of said drain subregions, said further electrode being disposed on said insulator film on a side of each of said drain subregions opposite said source region.

26. A MIS-FET as claimed in claim 25, wherein said further electrode has edges vertically aligned with edges of said drain subregions on a side away from said source region.

27. A MIS-FET as claimed in claim 25, wherein said further electrode is disposed above junction faces between said drain subregions and said substrate region.

28. A MIS-FET as claimed in claim 25, wherein said further electrode has an edge at a predetermined distance from junction faces between said drain subregions and said substrate region so that said further electrode is not disposed above said junction faces.

29. A MIS-FET as claimed in claim 17, wherein said drain region includes an edge on a side away from said source region.

30. A MIS-FET as claimed in claim 29, wherein said further electrode has an edge vertically aligned with said drain region edge.

31. A MIS-FET as claimed in claim 29, wherein said further electrode is disposed above a junction face between said drain region and said substrate region.

32. A MIS-FET as claimed in claim 29, wherein said further electrode has an edge at a predetermined distance from a junction face between said drain region and said substrate region so that said further electrode is not disposed above said junction face.

33. A MIS-FET as claimed in claim 1, wherein said further electrode is not in contact with a drain electrode, said drain electrode being in contact with said drain region.

34. A MIS-FET as claimed in claim 17, wherein said further electrode is not in contact with a drain electrode, said drain electrode being in contact with said drain region.

* * * * *